(12) United States Patent
Greenwald et al.

(10) Patent No.: US 6,871,920 B2
(45) Date of Patent: Mar. 29, 2005

(54) QUICK-MOUNT SUPPORT SYSTEM FOR TELESCOPING SLIDE

(75) Inventors: William B. Greenwald, Beech Grove, IN (US); Richard C. Evans, Shelbyville, IN (US); Kerry D. Heath, Indianapolis, IN (US); Jeff L. Naue, New Palestine, IN (US)

(73) Assignee: General Devices Co., Inc., Indianapolis, IN (US)

( * ) Notice: Subject to any disclaimer, the term of this patent is extended or adjusted under 35 U.S.C. 154(b) by 77 days.

(21) Appl. No.: 10/600,660

(22) Filed: Jun. 20, 2003

(65) Prior Publication Data

US 2004/0094492 A1 May 20, 2004

Related U.S. Application Data

(60) Provisional application No. 60/390,612, filed on Jun. 21, 2002.

(51) Int. Cl.[7] .............................................. A47B 88/00
(52) U.S. Cl. .................................. 312/334.4; 312/223.1
(58) Field of Search ........................... 312/334.4, 334.5, 312/330.1, 265.1, 265.4, 223.1, 334.7, 350; 211/26; 384/22; 361/725, 727

(56) References Cited

U.S. PATENT DOCUMENTS

| | | | |
|---|---|---|---|
| 516,583 A | 3/1894 | Adkins | |
| 1,698,252 A | 1/1929 | Ashe | |
| 2,644,588 A | 7/1953 | Brown | |
| 2,749,200 A | 6/1956 | Kuss | |
| 2,809,086 A | 10/1957 | Fall | |
| 3,054,511 A | 9/1962 | Erismann | |
| 3,133,768 A | 5/1964 | Klakovich | |
| 3,697,034 A | * 10/1972 | Shell .......................... | 248/243 |
| 4,423,914 A | 1/1984 | Vander Ley | |
| 4,441,772 A | 4/1984 | Fielding et al. | |
| 4,474,492 A | 10/1984 | Fleitas | |
| 5,063,715 A | 11/1991 | Goodman | |
| 5,199,777 A | 4/1993 | Taima et al. | |
| 5,292,198 A | 3/1994 | Rock et al. | |
| 5,405,195 A | 4/1995 | Hobbs | |
| 5,433,517 A | 7/1995 | Fleisch | |
| 5,580,138 A | 12/1996 | Grabher | |
| 5,620,244 A | 4/1997 | Yang | |
| 5,632,542 A | 5/1997 | Krivec | |
| 5,671,988 A | 9/1997 | O'Neill | |
| 5,683,159 A | 11/1997 | Johnson | |
| 5,730,514 A | 3/1998 | Hashemi | |
| 5,823,648 A | 10/1998 | Domenig | |
| 5,904,412 A | 5/1999 | Lammens | |
| 6,027,194 A | 2/2000 | Fleisch | |
| 6,209,979 B1 | 4/2001 | Fall et al. | |
| 6,273,534 B1 | 8/2001 | Bueley et al. | |
| 6,422,399 B1 | 7/2002 | Castillo et al. | |
| 6,749,275 B2 * | 6/2004 | Cutler et al. ............. | 312/334.4 |
| 2004/0089779 A1 * | 5/2004 | Greenwald et al. ......... | 248/241 |

FOREIGN PATENT DOCUMENTS

CA 817754 7/1969

* cited by examiner

*Primary Examiner*—Janet M. Wilkens
(74) *Attorney, Agent, or Firm*—Barnes & Thornburg LLP

(57) ABSTRACT

A quick-mount support includes a fixed retainer adapted to extend into a first retainer aperture and a movable retainer having an arcuate slot and adapted to extend into a second retainer aperture. The quick-mount support further includes a pivotable actuator, apparatus for mounting the pivotable actuator for pivoting movement about an actuator pivot axis, and a driver coupled to the pivotable actuator and arranged to move in the arcuate slot in the movable retainer. Movable retainer pivots about the retainer pivot axis toward and away from the fixed retainer in response to pivoting movement of the pivotable actuator about the actuator pivot axis. In one illustrative embodiment, the mounting apparatus comprises an elastic, deformable O-ring for pivotally mounting the pivotable actuator about an anchor mount so that the actuator pivot axis can shift as the driver moves in the arcuate slot.

24 Claims, 9 Drawing Sheets

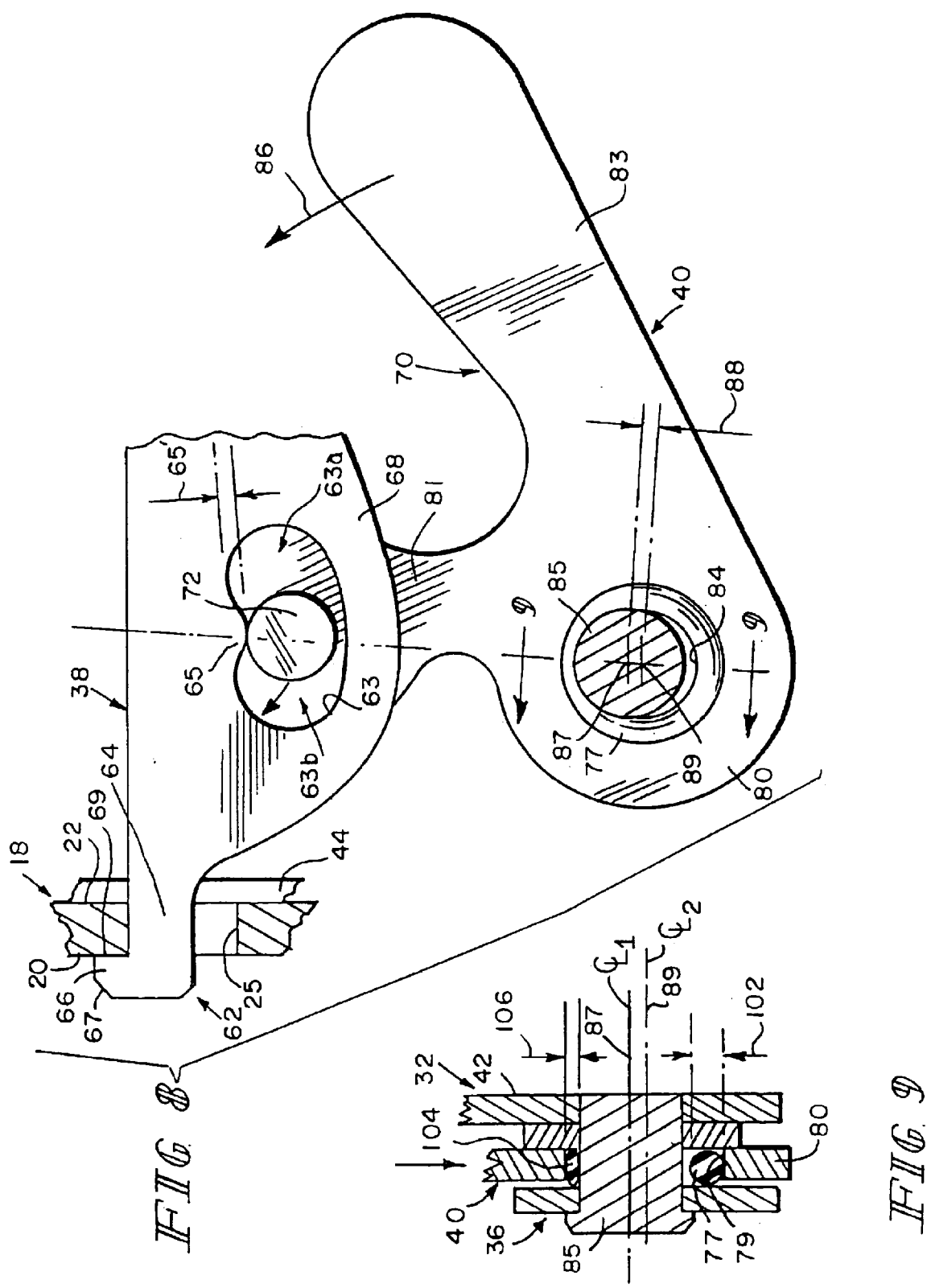

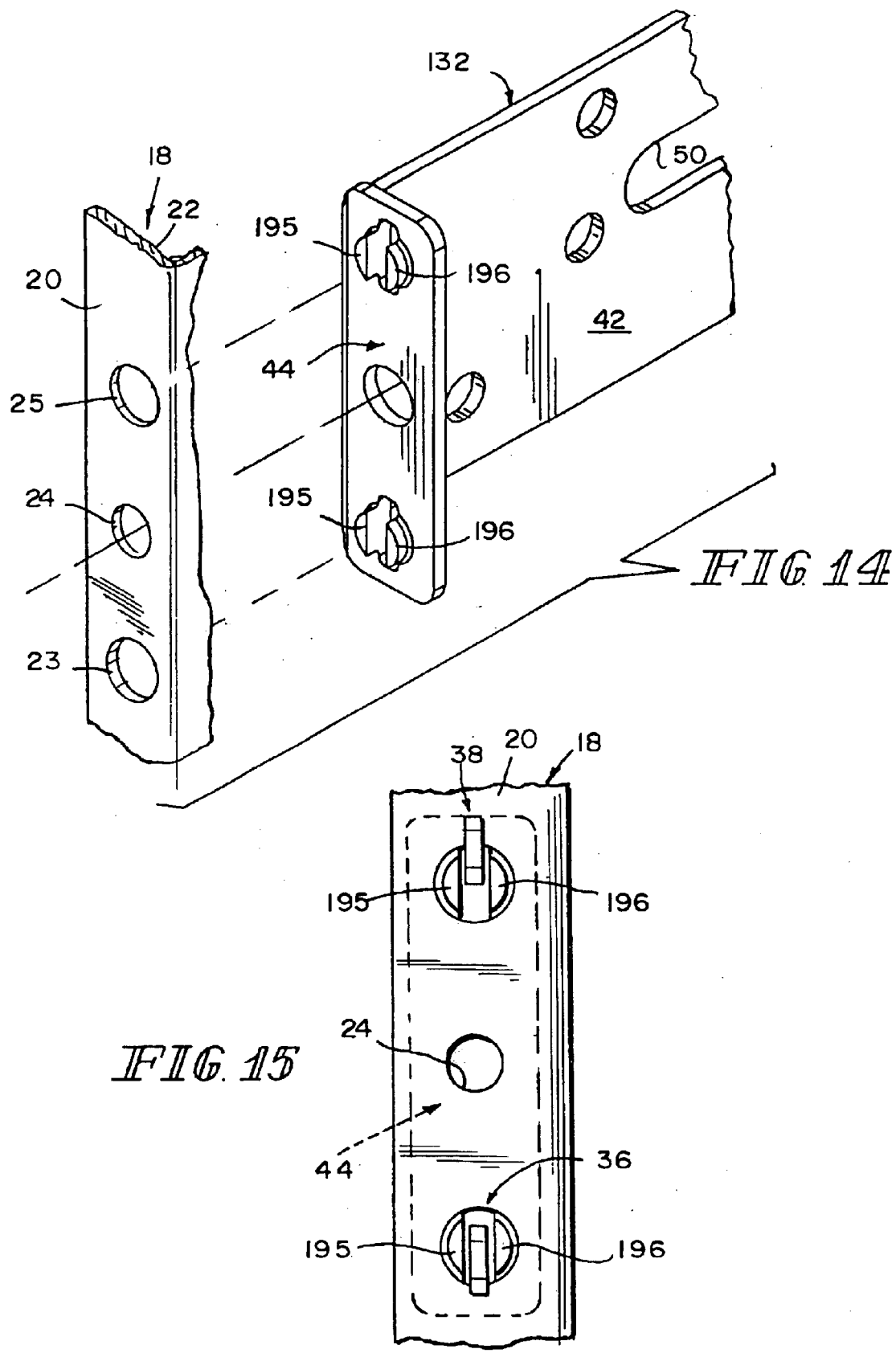

QUICK-MOUNT SUPPORT SYSTEM FOR TELESCOPING SLIDE

This application claims priority under 35 U.S.C. §119(e) to U.S. Provisional Application Ser. No. 60/390,612, filed Jun. 21, 2002, which is expressly incorporated by reference herein.

BACKGROUND AND SUMMARY

The present disclosure relates to telescoping slide assemblies, and particularly to telescoping slide assemblies mounted on racks to support a piece of equipment for movement relative to the rack. More particularly, the present disclosure relates to bracket systems for mounting telescoping slide assemblies on racks included in an equipment cabinet.

A telescoping slide assembly support system comprises a telescoping slide assembly, a vertical rack for use in an equipment cabinet, and a quick-mount support coupled to a stationary slide included in the telescoping slide assembly. The quick-mount support is configured to be coupled quickly and easily to the vertical rack to facilitate mounting the stationary slide included in the telescoping slide assembly in a fixed position relative to the vertical rack. A load-carrying slide also included in the telescoping slide can be coupled to a piece of equipment to support that equipment for movement relative to the vertical rack first into and out of the equipment cabinet.

In an illustrative embodiment, a quick-mount support includes a fixed retainer adapted to extend into a first retainer aperture formed in the vertical rack and a movable retainer having an arcuate slot and adapted to extend into a second retainer aperture formed in the vertical rack. The quick-mount support further includes a pivotable actuator, means for mounting the pivotable actuator for pivoting movement about an actuator pivot axis, and a driver coupled to the pivotable actuator and arranged to move in the arcuate slot in the movable retainer. The movable retainer pivots about the retainer pivot axis toward and away from the fixed retainer to unmate and mate the quick-mount support and the vertical rack in response to pivoting movement of the pivotable actuator about the actuator pivot axis.

In one illustrative embodiment, the mounting means comprises an elastic, deformable O-ring. The elastic, deformable O-ring supports the pivotable actuator for pivotable movement about an actuator pivot axis so that the actuator pivot axis can shift as the driver moves in the arcuate slot.

Features of the present disclosure will become apparent to those skilled in the art upon consideration of the following detailed description of illustrative embodiments exemplifying the best mode of carrying out the disclosure as presently perceived.

BRIEF DESCRIPTION OF THE DRAWINGS

The detailed description particularly refers to the accompanying figures in which:

FIG. 8 is an enlarged view of a portion of the quick-mount support and perforated front wall of the vertical rack showing movement of the movable actuator in a counterclockwise direction relative to an anchor mount arranged to extend through a central aperture formed in the deformable O-ring mounted in the movable actuator about the "floating" pivot axis (that is offset from the central axis of the fixed anchor mount) and movement of the driver pin included in the retainer mover in the boomerang-shaped slot formed in the pivotable retainer;

FIG. 9 is a sectional view taken along line 9—9 of FIG. 8 showing movement of the floating pivot axis owing to compression of one portion of a deformable O-ring mounted in an aperture formed in the Y-shaped actuator to receive the anchor mount coupled to the fixed retainer;

FIG. 14 shows another embodiment of a mounting bracket configured to mate with apertures formed in the perforated front wall of the vertical rack;

FIG. 15 is an end elevation of components shown in FIG. 14 following mating of the mounting bracket and the perforated front wall of the vertical rack and movement of a retainer lug associated with the fixed retainer to a locked position and movement of a retainer lug associated with the movable retainer to a raised and locked position.

DETAILED DESCRIPTION

Figure 1:
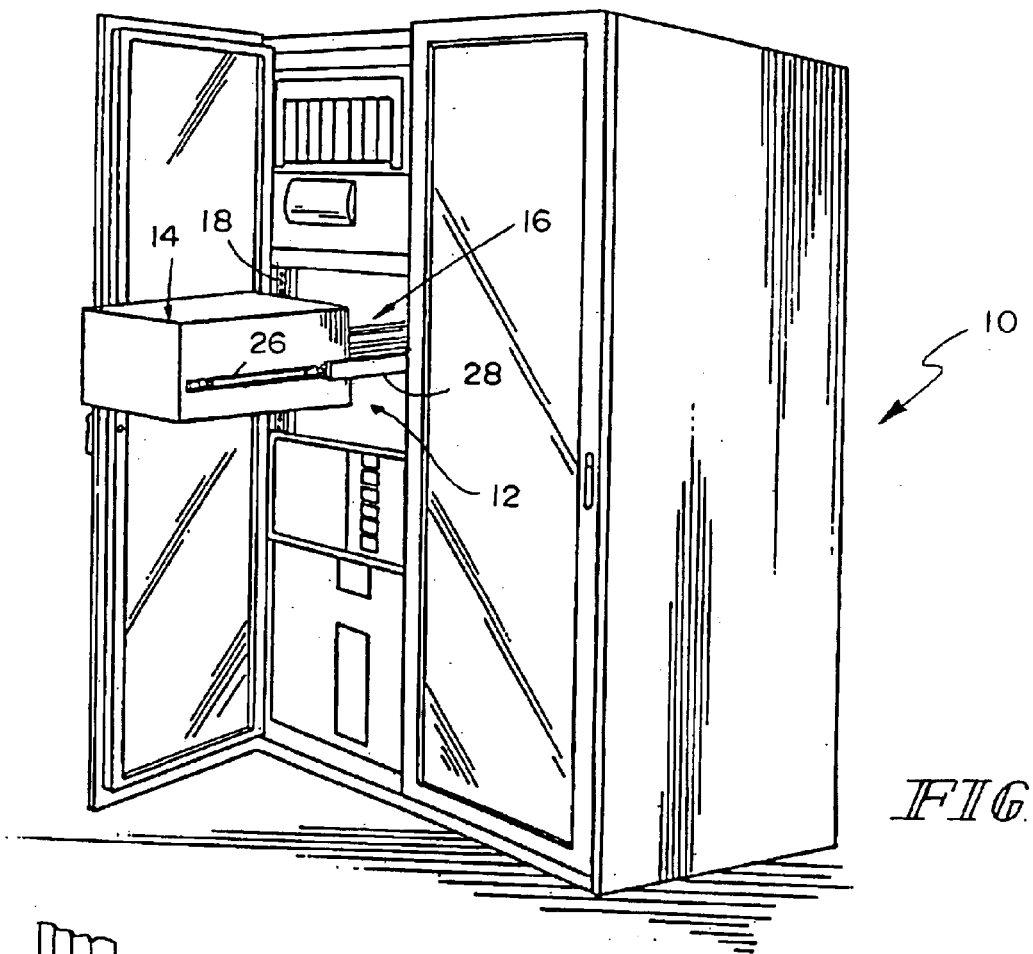
FIG. 1 is a perspective view showing a piece of equipment mounted on two fully extended telescoping slide assemblies that are mounted on vertical racks provided inside a cabinet to enable a technician to move the piece of equipment easily into and out of the cabinet.
Figure 2:
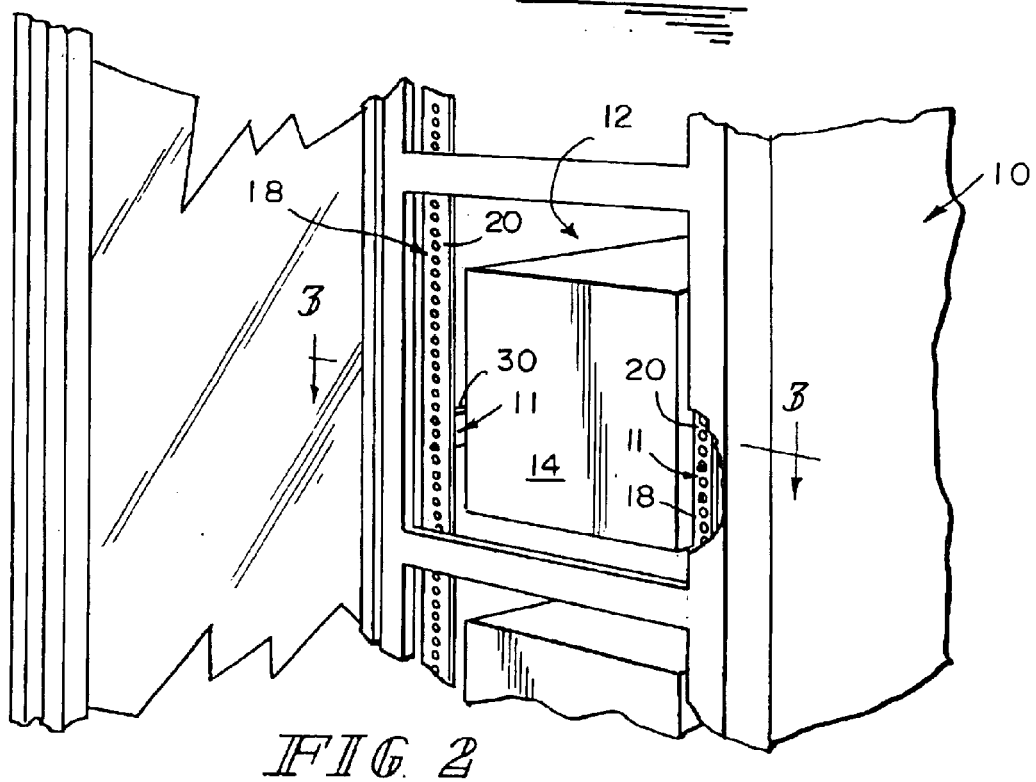
FIG. 2 is a partial perspective view of the cabinet of FIG. 1, with portions broken away, showing the piece of equipment located inside the cabinet owing to the full retraction of the telescoping slide assemblies inside the cabinet and showing two forward vertical racks and a series of retainer apertures formed in each of the forward vertical racks wherein two retainers associated with a quick-mount support coupled to a "left-side" slide assembly extend into two of the retainer apertures formed in a left-side forward vertical rack and two retainers associated with a quick-mount support coupled to a "right-side" slide assembly extend into two of the retainer apertures formed in a right-side forward vertical rack.

An equipment cabinet 10 includes an interior region 12 adapted to store equipment therein as shown, for example, in FIGS. 1 and 2. A piece of equipment 14 is mounted on a pair of spaced-apart telescoping slide assemblies 16 for movement thereon between a fully extended position away from cabinet 10 as shown in FIG. 1 and a fully retracted position within cabinet 10 as shown in FIG. 2. Vertical racks 18 are mounted in cabinet 10 as shown, for example, in FIGS. 1–3 and telescoping slide assemblies 16 are mounted to these vertical racks 18 using the quick-mount support system disclosed herein.

Figure 5:
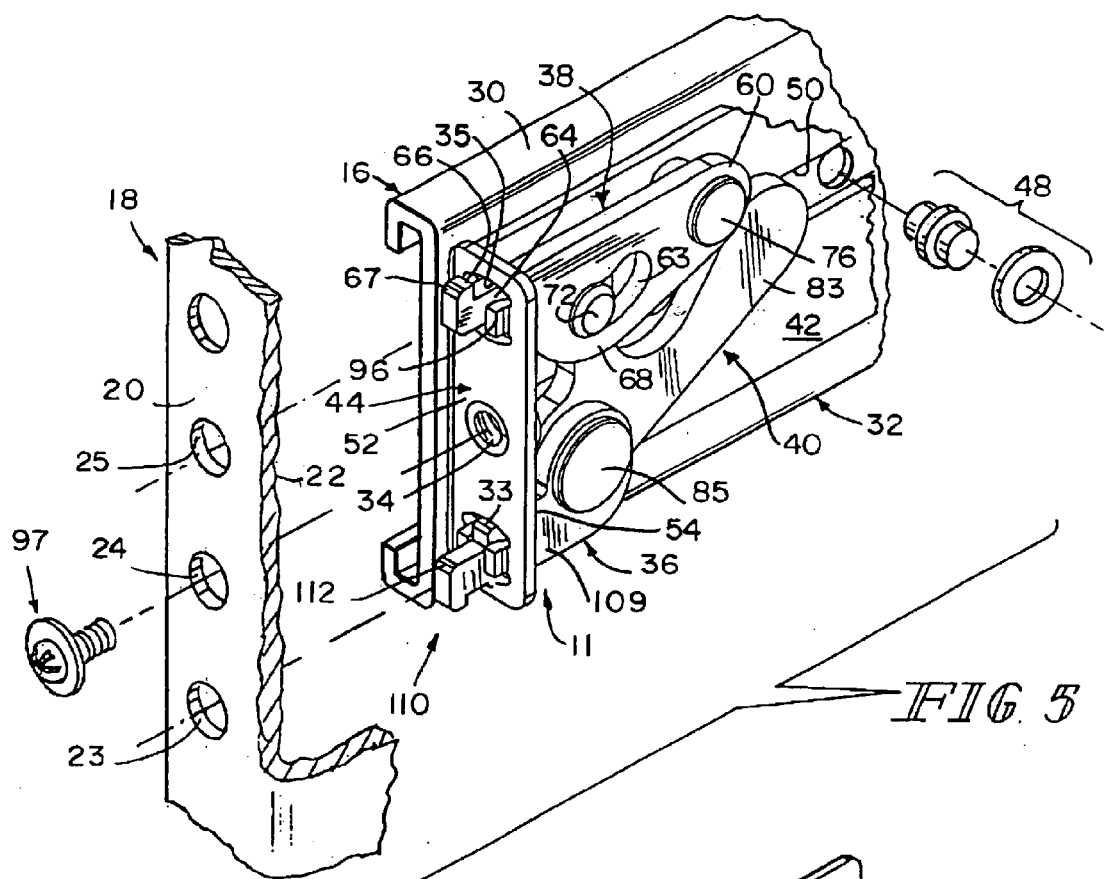
FIG. 5 is an enlarged perspective view of the quick-mount support of FIG. 4 after it has been assembled and mounted on one end of a stationary slide included in the three-part telescoping slide assembly and showing a pivotable retainer having a retainer lug extending through an aperture formed in a mounting bracket, a fixed retainer located below the pivotable retainer, a movable Y-shaped actuator provided with a finger grip and a driver arm carrying a driver pin movable in a boomerang-shaped slot formed in the pivotable retainer to cause the pivotable retainer to pivot about its pivot axis to move the retainer lug up or down in the mounting bracket aperture in response to movement of the actuator and the deformable O-ring carried therein relative to the fixed retainer about a "floating" pivot axis as suggested in FIGS. 6–8.
Figure 6:
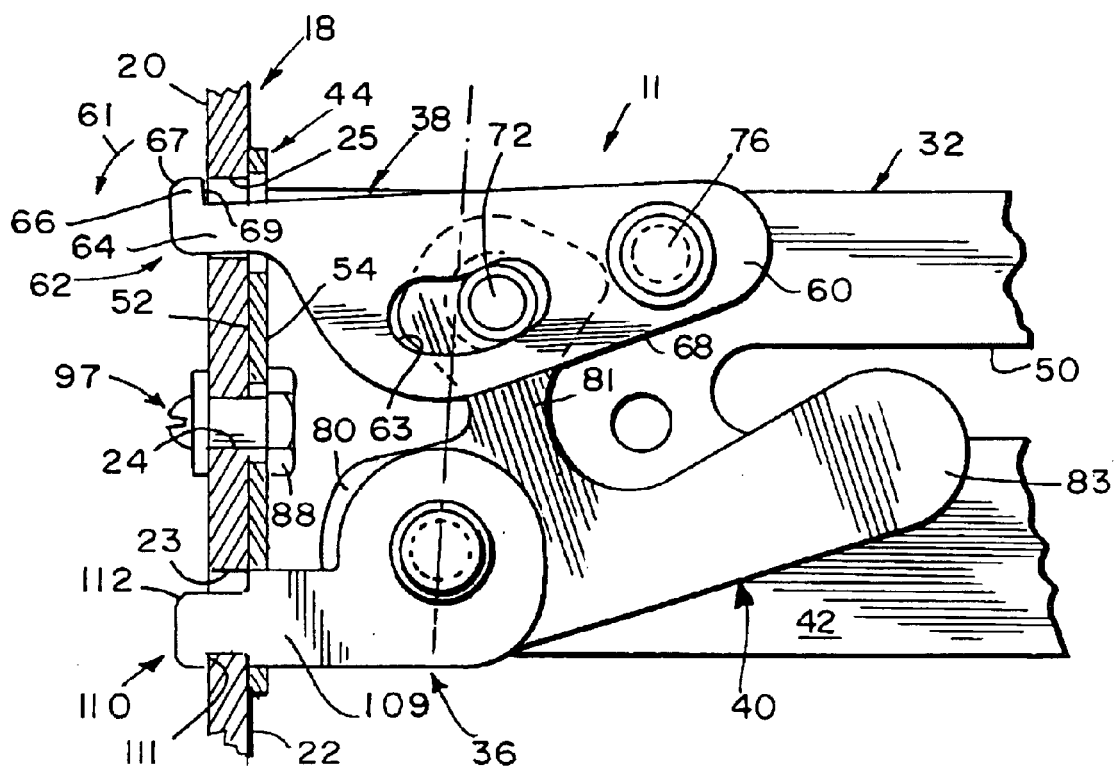
FIG. 6 is an enlarged side elevation view of the quick-mount support of FIG. 5 after the mounting bracket has been moved to engage the perforated front wall of the vertical rack and showing the retainer lug of the fixed retainer in a locked position in a lower one of the retainer apertures formed in the perforated front wall and the retainer lug of the pivotable retainer in a lowered and unlocked position in an upper one of the retainer apertures formed in the perforated front wall.
Figure 7:
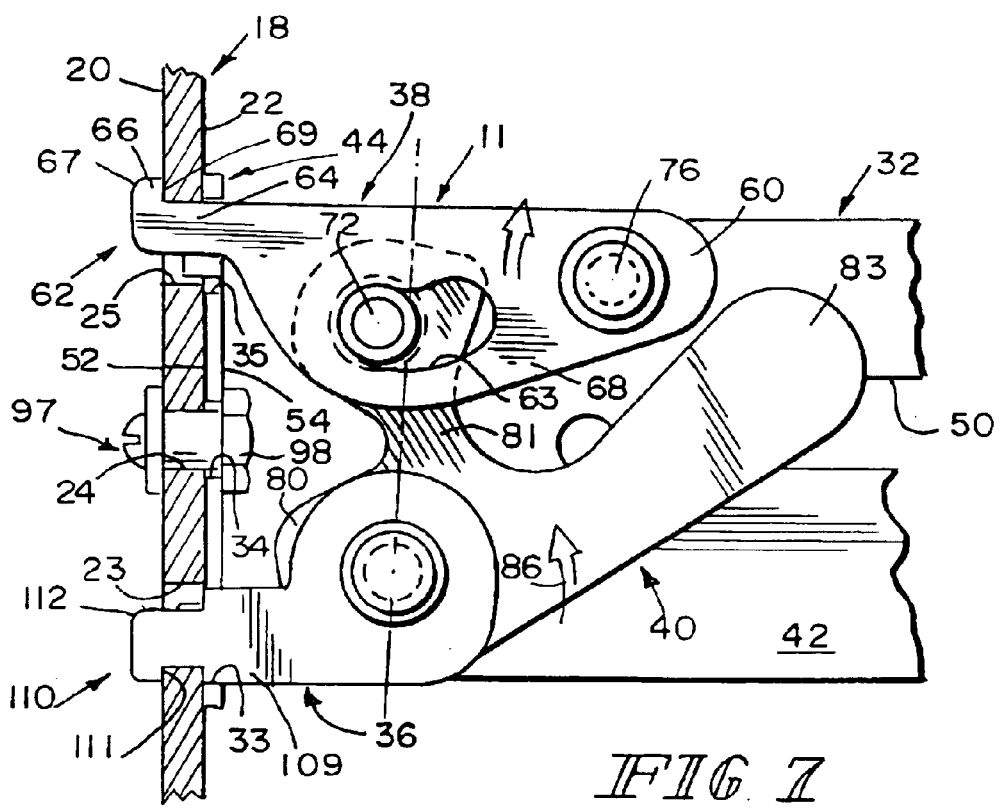
FIG. 7 is a side elevation view similar to FIG. 6 showing the retainer lug of the pivotable retainer in a "raised and locked" position in the upper one of the retainer apertures formed in the perforated front wall following counterclockwise movement of the movable actuator about the floating pivot axis to move the driver pin from right to left in the boomerang-shaped slot to pivot the pivotable actuator in a clockwise direction about its pivot axis.
Figure 11:
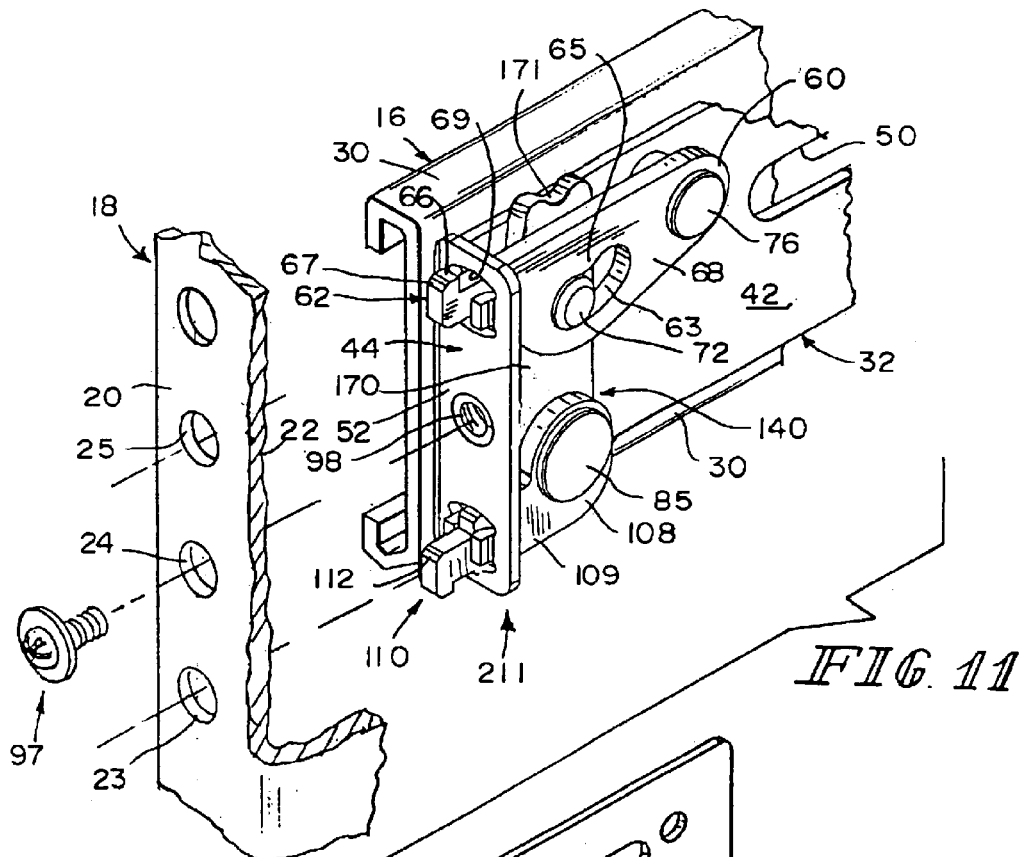
FIG. 11 is an enlarged perspective view of the quick-mount support of FIG. 10 after it has been assembled and mounted on one end of a stationary slide included in the three-part telescoping slide assembly and showing a fixed retainer having a downwardly turned retainer lug extending through a lower aperture formed in a mounting bracket, a pivotable retainer having an upwardly turned retainer lug extending through an upper aperture formed in the mounting bracket, a movable upright, elongated actuator having a finger grip located above the pivotable retainer and carrying a drive pin arranged to move the boomerang-shaped slot formed in the pivotable retainer to cause the pivotable retainer to pivot about its pivot axis to move the upwardly turned retainer lug up or down in the upper aperture formed in the mounting bracket in response to movement of the upright, elongated actuator and the deformable O-ring carried therein relative to the fixed retainer about a "floating" pivot axis.
Figure 10:
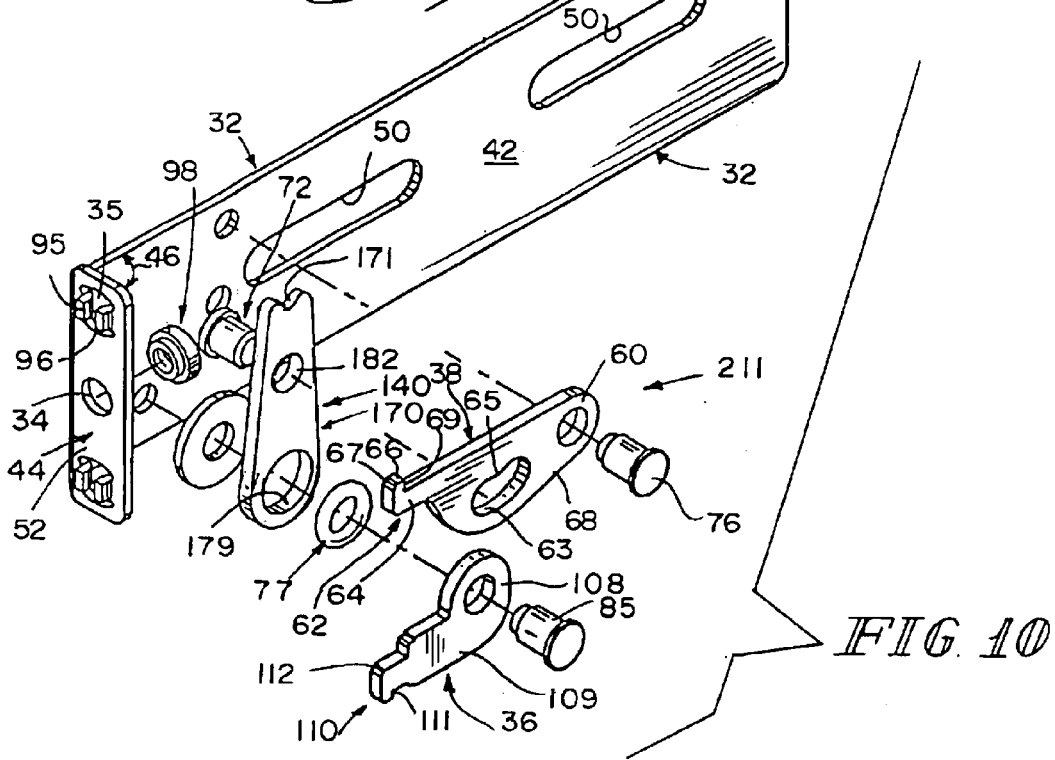
FIG. 10 is an enlarged perspective view of various components that can be assembled as shown, for example, in FIG. 11 to produce a quick-mount support in accordance with a second embodiment of this disclosure and showing a "P-shaped" fixed retainer, a pivotable retainer located above the P-shaped fixed retainer and formed to include a "boomerang-shaped" slot, a pivot axis associated with the right end of the pivotable retainer, and a retainer mover including a driver pin sized to move in the boomerang-shaped slot and an upright, elongated actuator formed to include a finger grip at one end, an aperture adapted to receive a deformable O-ring therein at the other end, and a middle aperture adapted to receive the driver pin therein to allow the driver pin to extend into the boomerang-shaped slot formed in the pivotable retainer.

Each vertical rack 18 includes a forwardly facing surface 20, a rearwardly facing surface 22, and a series of retainer vertically-spaced apertures 23, 24, 25, etc., as shown, for example, in FIGS. 5–7. Each vertical rack 18 is coupled to equipment cabinet 10 and positioned in the interior region 12 as shown, for example, in FIG. 3. It is within the scope of this disclosure to configure and orient rack 18 to support slide assemblies in a wide variety of locations within cabinet 10. In many instances, rack 18 will have a "vertical" orientation but other orientations fall within the scope of this disclosure.

Telescoping slide assembly 16 includes any suitable number of slides. In the illustrations, telescoping slide assembly 16 includes interconnected load-carrying slide 26, intermediate slide 28, and stationary slide 30. These slides 26, 28, and 30 are movable relative to one another to extend and retract load-carrying slide 26 relative to stationary slide 30 between fully extended and retracted positions as suggested in FIGS. 1 and 2. Piece of equipment 14 is coupled to spaced-apart load-carrying slides 26 in any suitable manner as shown, for example, in FIG. 3. It is within the scope of this disclosure to omit intermediate slide 28 or add additional intermediate slides (not shown).

Figure 12:
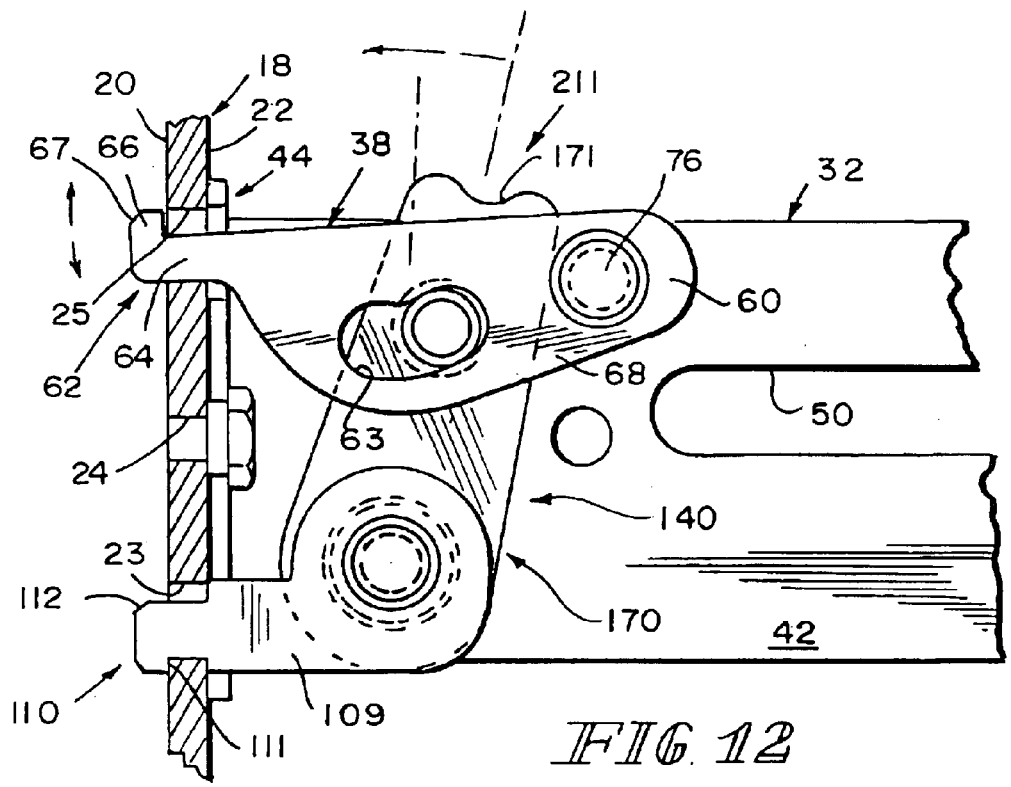
FIG. 12 is an enlarged side elevation view of the quick-mount support of FIG. 11 after the mounting bracket has been moved to engage the perforated front wall of the vertical rack and showing the retainer lug of the fixed retainer in a locked position in a lower one of the retainer apertures formed in the perforated front wall and the retainer lug of the pivotable retainer in a "lowered and unlocked" position in an upper one of the retainer apertures formed in the perforated front wall.
Figure 13:
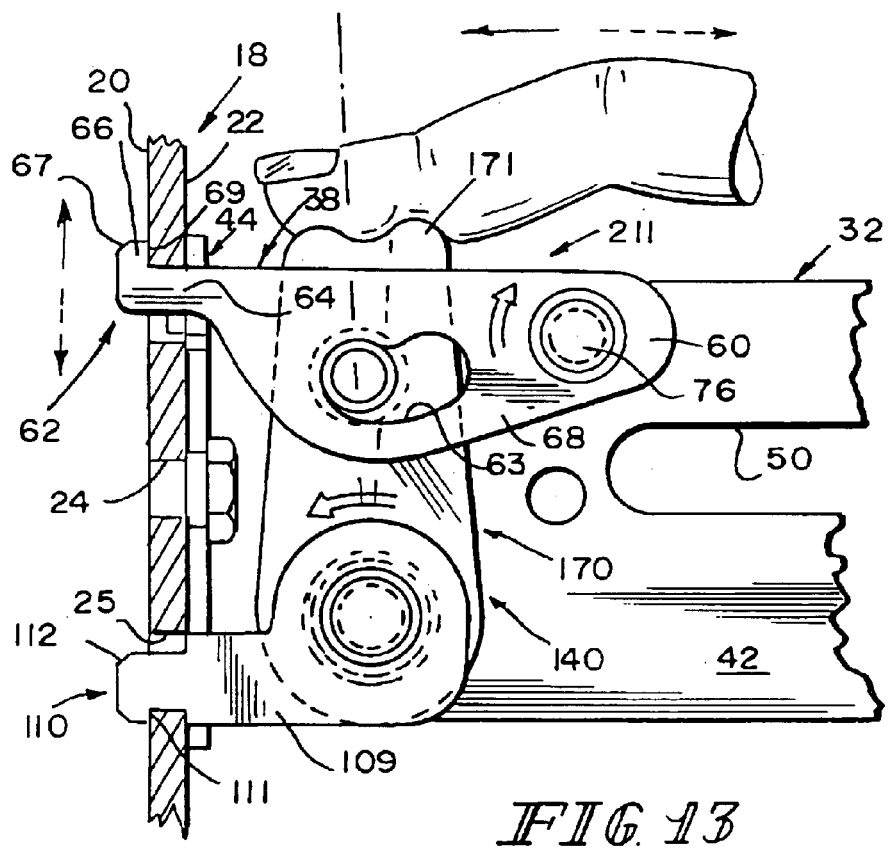
FIG. 13 is a side elevation view similar to FIG. 12 showing the retainer lug of the pivotable retainer in a "raised and locked" position in the upper one of the retainer apertures formed in the perforated front wall following counterclockwise movement of the movable actuator about the floating pivot axis and clockwise movement of the pivotable retainer about its pivot axis.
Figure 16:
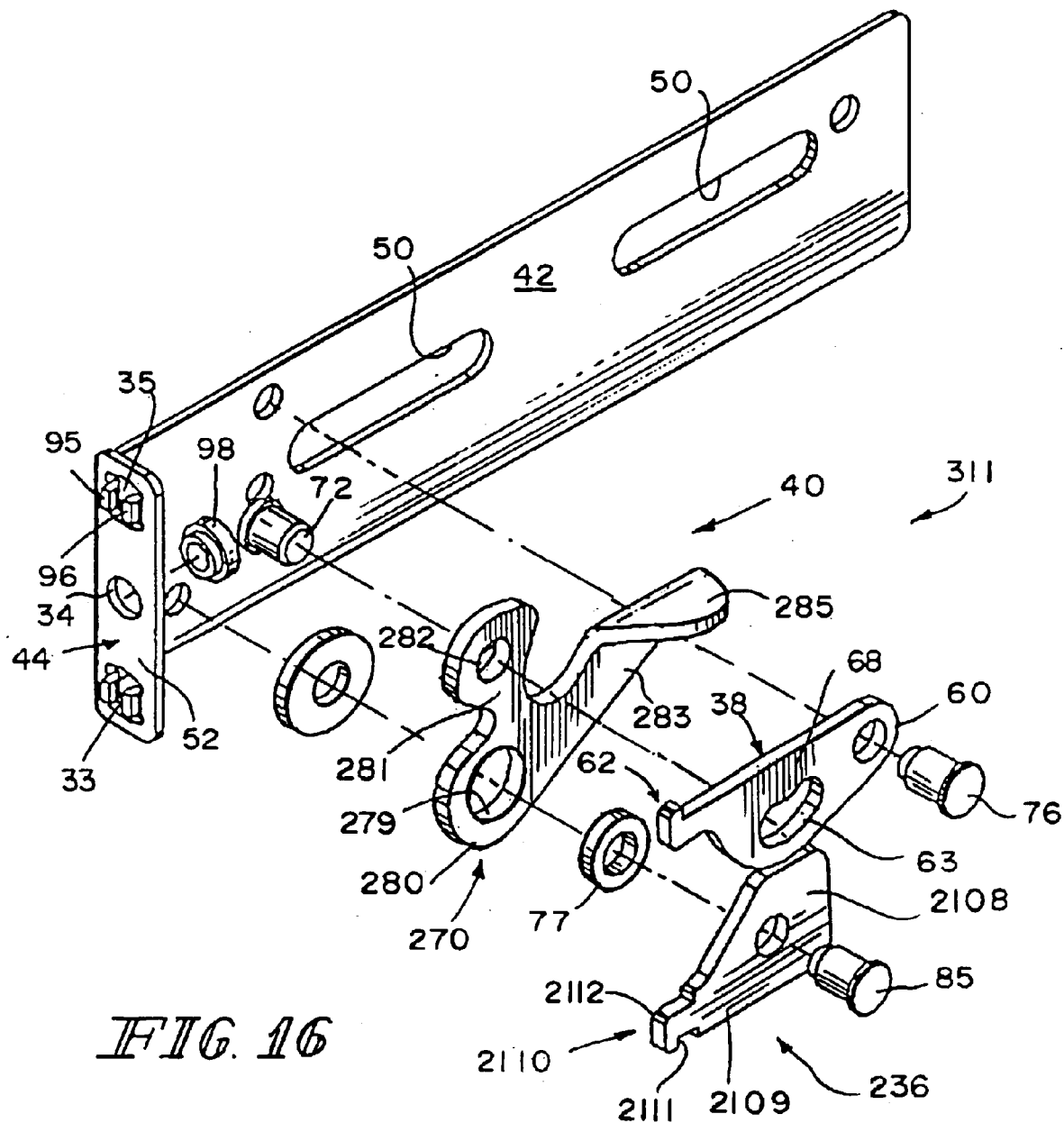
FIG. 16 is an exploded perspective view similar to FIG. 4 showing another embodiment of a quick mount support similar to the embodiment of FIGS. 4–9.

A quick-mount support 11 in accordance with a first embodiment of this disclosure is shown in FIGS. 4–9 and a quick-mount support 211 in accordance with a second embodiment of this disclosure is shown in FIGS. 10–13. Still another embodiment of a quick-mount support 311 is shown in FIG. 16. Quick-mount support 311 is a variation of quick mount support 11. Each of quick-mount supports 11, 211, 311 can be operated quickly and easily by a technician provided with access to interior region 12 of equipment cabinet 10 to couple quick-mount support 11 to vertical rack 18 as shown in FIGS. 6 and 7, to couple quick-mount support 211 to vertical rack 18 as shown in FIGS. 12 and 13 and to couple quick-mount support 311 to vertical rack 18 (not shown).

A pair of quick-mount supports 11 is provided so that each end of each stationary slide 30 can be mounted to an adjacent vertical rack 18 quickly and easily. Thus, the telescoping slide assemblies 16 used to support equipment 14 are positioned in spaced-apart parallel relation to one another in fixed positions on vertical racks 18.

Figure 4:
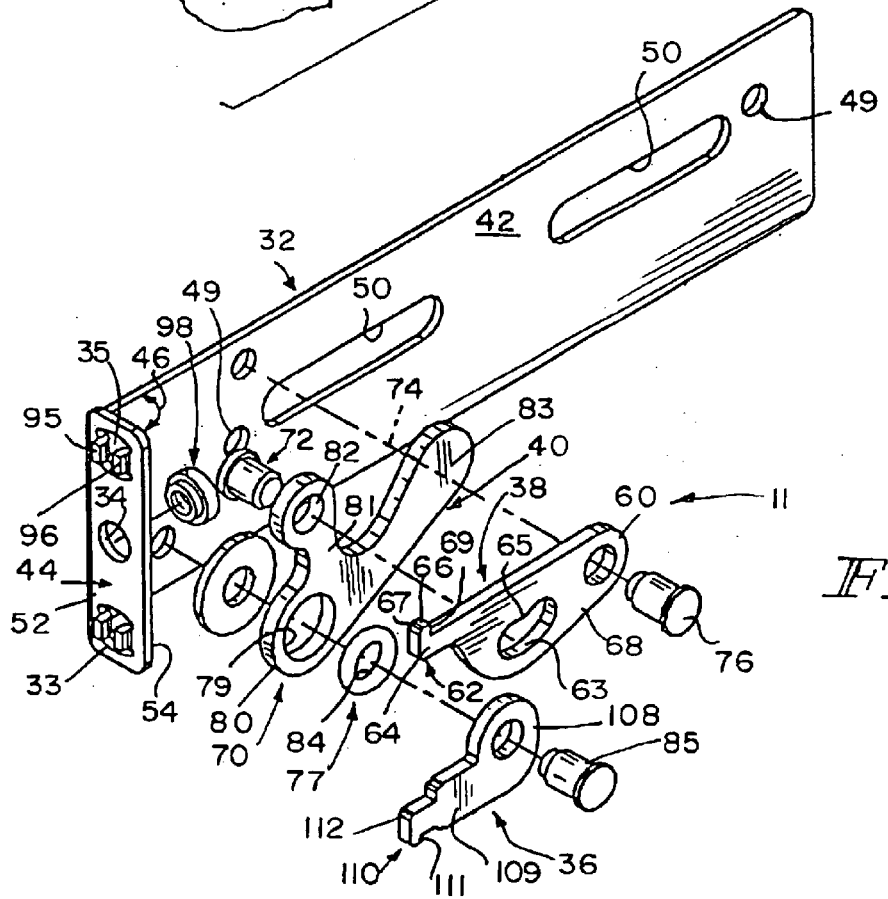
FIG. 4 is an enlarged perspective view of various components that can be assembled as shown, for example, in FIG. 5, to produce a quick-mount support in accordance with a first embodiment of this disclosure and showing a "P-shaped" fixed retainer, a pivotable retainer located above the P-shaped fixed retainer and formed to include a "boomerang-shaped" slot, a pivot axis associated with the "right" end of the pivotable retainer, and a retainer mover including a driver pin sized to move in the boomerang-shaped slot and a "Y-shaped" actuator adapted to receive a deformable O-ring therein and arranged to carry the driver pin and move about a "floating" pivot axis relative to the fixed retainer during deformation of the O-ring to cause the driver pin to move in the boomerang-shaped slot and thus pivot the pivotable retainer about its pivot axis.

Quick-mount support 11 includes a slide support bracket 32 coupled to stationary slide 30 and formed to include a series of vertically-spaced retainer apertures 33, 34, and 35, as shown, for example, in FIGS. 4 and 5. Quick-mount support 11 further includes a fixed retainer 36 mounted to extend through retainer aperture 33 and adapted to extend into first retainer aperture 23 formed in vertical rack 18 when slide support bracket 32 is mated to vertical rack 18. Quick-mount support 11 also includes a movable (e.g., pivotable) retainer 38 and a retainer mover 40 configured to move movable retainer 38 between raised and lowered positions in a retainer passageway defined by aligned retainer apertures 25, 35 (when operated by a technician) when slide support bracket 32 is mated to vertical rack 18 so that quick-mount support 11 can be coupled to and uncoupled from vertical rack 18 quickly and easily in a manner suggested in FIGS. 6 and 7.

Retainer mover 40 includes an elastic, deformable O-ring 77 (shown best in FIGS. 4, 8, and 9) arranged to mate with an anchor mount 85 coupled to slide support bracket 32 to extend the limited range of movement of retainer mover 40 relative to anchor mount 85. In the illustrated embodiment, anchor mount 85 extends through a central aperture formed in O-ring 77 and deforms a portion of O-ring 77 as retainer mover 40 is "pivoted" about anchor mount 85 to move movable retainer 38 between a "lowered and unlocked" position shown in FIG. 6 and a "raised and locked" position shown in FIG. 7.

Figure 3:
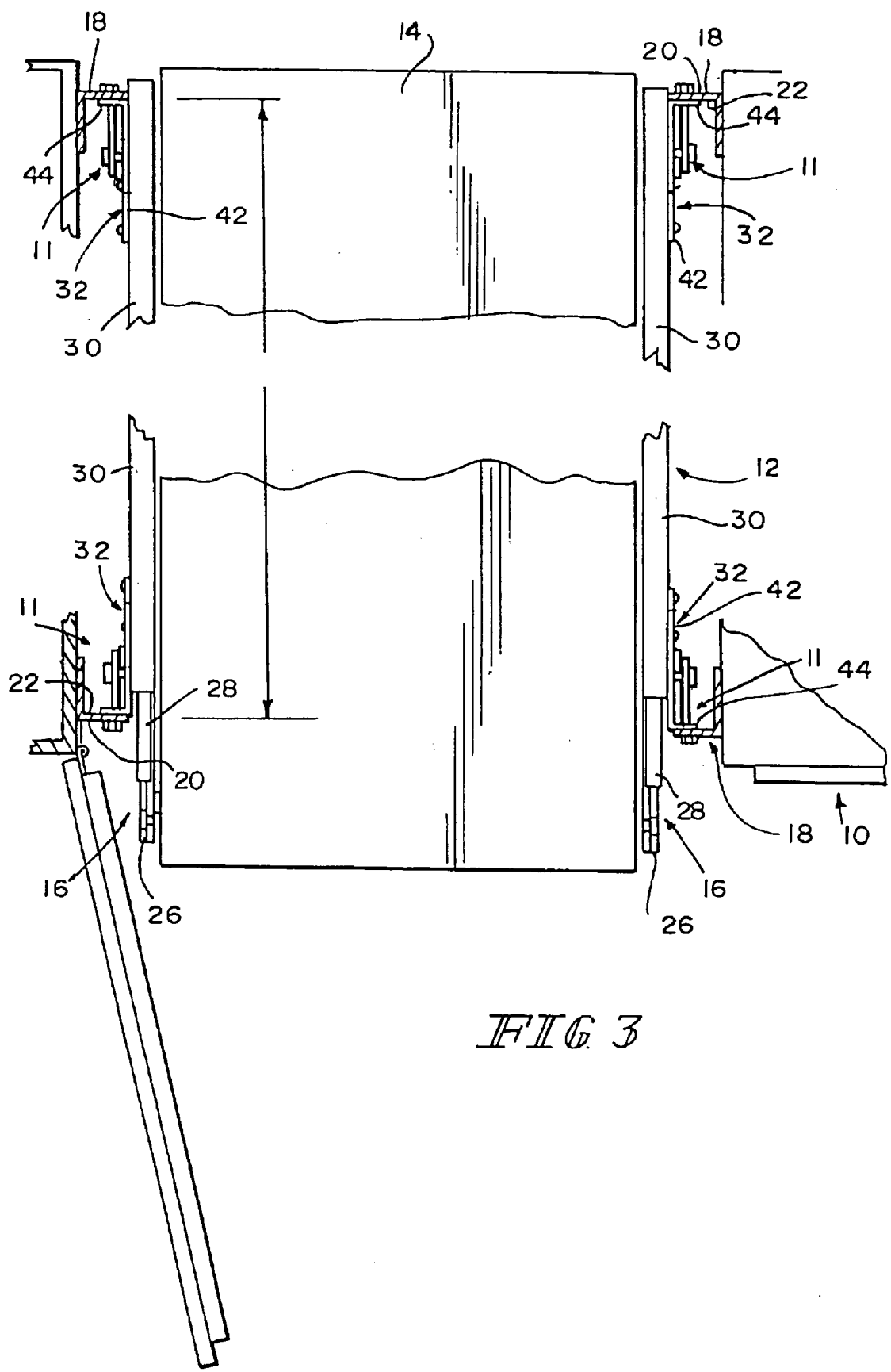
FIG. 3 is a sectional view taken along line 3—3 of FIG. 2 after the piece of equipment has been moved on the telescoping slide assemblies a short distance out of the cabinet showing a pair of spaced-apart three-part telescoping slide assemblies, a piece of equipment mounted therebetween, and four quick-mount supports and showing that each quick-mount support is coupled to one of the forward and rearward vertical racks and to a nearby portion of one of the telescoping slide assemblies to anchor the slide assemblies to the vertical racks.

Slide support bracket 32 includes a slide mount portion 42 coupled to stationary slide 30 and a rack mount portion 44 arranged at an angle 46 to slide mount portion 42 as shown, for example, in FIGS. 3 and 4. Fasteners 48 can be arranged to extend through apertures 49 or slots 50 formed in slide mount portion 42 to engage stationary slide 30. Fasteners 48 are arranged to extend through apertures 49 so that slide support bracket 32 is mounted in a fixed position on one end of stationary slide 30. Alternatively, fasteners 48 are arranged (as suggested in FIG. 5) to extend through slots 50 to support slide mount portion 42 for limited sliding movement relative to stationary slide 30. In one embodiment, angle 46 is about 90° and slide support bracket 32 is a monolithic element wherein slide and rack mount portions 42, 44 are formed of one material (e.g., metal).

Rack mount portion 44 includes a forwardly facing surface 52 and a rearwardly facing surface 54 as shown, for example, in FIG. 5. Forwardly facing surface 52 of rack mount portion 44 is arranged to lie in mating relation to rearwardly facing surface 22 of vertical rack 18 to align a retainer aperture 25 in vertical rack 18 with the retainer aperture 35 formed in rack mount portion 44 to form a retainer passageway 25, 35 extending from forwardly facing surface 20 of vertical rack 18 to rearwardly facing surface 54 of rack mount portion 44 as shown, for example, in FIGS. 6 and 7. It is within the scope of this disclosure to place an intervening element between rack mount portion 44 and vertical rack 18 so long as a retainer passageway 25, 35 is provided to receive movable retainer 38 therein to anchor rack mount portion 44 to vertical rack 18.

As shown best in FIG. 4, movable retainer 38 includes a base 60, a retainer lug 62 including a lug body 64 and a lug head 66, and a mid-section 68 arranged to interconnect base 60 and lug body 64 and formed to include a "boomerang-shaped" slot 63. Retainer lug body 64 is sized to move into retainer passageway 25, 35 during coupling and uncoupling of quick-mount support 11 and vertical rack 18 as suggested in FIGS. 6 and 7. Retainer lug body 64 is also sized to move back and forth in that retainer passageway 25, 35 between a "lowered and unlocked position" shown, for example, in FIG. 6 and a "raised and locked position" shown, for example, in FIG. 7. In the lowered and unlocked position, retainer lug 62 is arranged to pass into and out of its companion retainer passageway 25, 35 easily under the control of a technician engaged in the business of coupling or uncoupling quick-mount support 11 from a companion vertical rack 18. In the raised and locked position, a rearwardly facing surface 69 on lug head 66 is arranged to mate with forwardly facing surface 20 of vertical rack 18 (as suggested in FIG. 7) to block movement of lug head 66 (and thus retainer lug 62 of movable retainer 38) through retainer passageway 25, 35 so as to prevent uncoupling of quick-mount support 11 and vertical rack 18.

Lug head 66 is formed to include inclined cam surface 67. Inclined cam surface 67 is arranged to engage an edge formed on vertical rack 18 to define retainer aperture 25 and to urge movable retainer 38 in a direction 61 (see FIG. 6) toward the lowered position during movement of movable retainer 38 in retainer aperture 25.

Retainer mover 40 is configured to be used by a technician to move retainer lug 62 quickly and easily to either its (1) lowered and unlocked position or (2) raised and locked position. In the illustrated embodiment, retainer mover 40 includes a movable actuator 70 and a driver pin 72 pivotably coupled to the movable actuator 70 and arranged to move in boomerang-shaped slot 63 formed in mid-section 68 of movable retainer 38 to cause movable retainer 38 to pivot about a retainer pivot axis 74 established by pivot mount 76 to move retainer lug body 64 in retainer passageway 25, 35 between the (1) lowered and unlocked position and (2) the raised and locked position in response to movement of movable actuator 70 about a "floating" pivot axis 89 established, in part, by a deformable O-ring 77 mounted in an aperture 79 formed in movable actuator 70 as suggested in FIGS. 8 and 9. In the illustrated embodiment, the deformable O-ring 77 constitutes the means for mounting the pivotable actuator for pivoting movement about the actuator pivot axis 89. Although a deformable O-ring is used in the illustrated embodiment, any suitable deformable or resilient means may be used. Also, it is possible to eliminate deformable O-ring 77, and instead pivotally mount movable actuator 70 directly on anchor mount 85. Aperture 79 may be sized to allow some floating movement of movable actuator 70 as driver pin 72 moves in boomerang-shaped slot 63.

In the embodiment illustrated in FIGS. 4–9, pivot mount 76 is coupled to slide mount portion 42 of slide support bracket 32. Base 60 of movable retainer 38 is arranged to intercept retainer pivot axis 74 as suggested in FIG. 4.

As shown best in FIGS. 4 and 8, movable actuator 70 includes a hub 80 formed to include O-ring receiver aperture 79, a driver arm 81 cantilevered to hub 80 and formed to include a driver pin aperture 82 adapted to receive driver pin 72 therein, and a lever arm 83 cantilevered to hub 80 and shaped to be gripped by a user. Driver arm 81, hub 80, and lever arm 83 are arranged and shaped in the illustrated embodiment to cause movable actuator 70 to be somewhat Y-shaped.

A modified movable actuator 270 is shown in FIG. 16. Movable actuator 270, like movable actuator 70, includes a hub 280 having O-ring receiver aperture 279, a driver arm 281 cantilevered to hub 280 and formed to include a driver pin aperture 282 adapted to receive driver pin 72 therein, and a lever arm 283 cantilevered to hub 280. Movable actuator 270 is similar to movable actuator 70 with the exception that movable actuator 270 is formed to include a turned-out finger grip tab 285 at one end thereof that is shaped to be gripped by a user. As shown, turned-out finger grip tab 285 extends generally perpendicularly from an end portion of lever arm 283.

O-ring 77 is made of, for example, buna rubber and has an inner diameter of about 0.250 inch and an outer diameter of about 0.437 inch and is made of a tubular material having a diameter of about 0.093 inch. It is within the scope of this disclosure to make O-ring 77 using other suitable elastic materials. O-ring 77 is designed to deform elastically somewhat as suggested in FIGS. 8 and 9 during movement of driver pin 72 back and forth in boomerang-shaped slot 63 formed in movable retainer 38. O-ring 77 is formed to include a central aperture 84 sized to receive anchor mount 85 therein and anchor mount 85 is coupled to slide mount portion 42 of slide support bracket 32 to anchor fixed retainer 36 in place on bracket 32 and to extend through aperture 84 formed in O-ring 77.

Driver pin 72 included in movable actuator 40 moves from a right lobe channel 63a in boomerang-shaped slot 63 (see FIG. 6), past an "over-center position" (see FIG. 8), into a left lobe channel 63b in boomerang-shaped slot 63 (see FIG. 7) as lever arm 83 is moved in counterclockwise direction 86 about anchor mount 85 as suggested in FIGS. 7 and 8. Such movement of driver pin 72 occurs when lever arm 83 of movable actuator 40 is used to move retainer lug body 64 in retainer passageway 25, 35 between the lowered and unlocked position shown in FIG. 6 and the raised and locked position shown in FIG. 7. In the over-center position shown in FIG. 8, driver pin 72 engages a protrusion 65 provided in mid-section 68 and arranged to extend into slot 63 to "mark" a junction between left lobe channel 63b and right lobe channel 63a of boomerang-shaped slot 63. Protrusion 65 has a "height" dimension 65' as shown in FIG. 8.

As suggested in FIGS. 8 and 9, the center line 89 of O-ring 77 (also the center line of O-ring receiver aperture 79 formed in movable actuator 70) moves a distance 88 from the center line 87 of anchor mount 85 as driver pin 72 reaches the over-center position in boomerang-shaped slot 63 owing to compression of a portion of deformable O-ring 77. Thus, the axis about which movable actuator 70 "pivots" appears to "float" as suggested in FIGS. 8 and 9; that is center lines 87 and 89 are not always coextensive during clockwise and counterclockwise movement of movable actuator 70 relative to anchor mount 85. Normally, in the illustrated embodiment, the diameter 102 of O-ring 77 is about 0.093 inch and, as suggested in FIG. 9, a portion 104 of O-ring 77 is compressed by relative movement between anchor mount 85 and hub 80 to a compressed dimension 106.

During use, as suggested in FIGS. 6–8, elastic O-ring 77 "yields" to allow driver pin 72 to move past the over-center position shown in FIG. 8 and then "expands" as driver pin 72 arrives at (1) a destination in left lobe channel 63b of boomerang-shaped slot 63 or (2) a destination in right lobe channel 63a of slot 63 to urge drive pin 72 to remain at the destination in slot 63. O-ring 77 allows for an expanded tolerance range during assembly of components used to create quick-mount support 11. O-ring 77 is yieldable to compensate for dimensional variations between movable actuator 70 and movable retainer 38.

As shown best in FIG. 4, fixed retainer 36 includes a base 108, a body 109, and a turned-out lug 110. Lug 110 includes a rearwardly facing surface 111 that is arranged to mate with forwardly facing surface 20 of vertical rack 18 and an inclined cam surface 112 that is similar in form and function to cam surface 67 on lug head 66 of movable retainer 38. Base 108 is formed to include an aperture adapted to receive anchor mount 85 therein.

FIG. 16 shows a modified fixed retainer 236. Fixed retainer 236, like fixed retainer 36, includes a base 2108, a body 2109, and a turned-out lug 2110. Lug 2110 includes a rearwardly facing surface 2111 that is arranged to mate with forwardly facing surface 20 of vertical rack 18 and an inclined cam surface 2112. Base 2108 is formed to include an aperture adapted to receive anchor mount 85 therein. Fixed retainer 236 is similar to fixed retainer 36 with the exception that base 2108 of fixed retainer 236 is trapezoidal, whereas base 108 of fixed retainer 36 is circular.

As shown best in FIGS. 4 and 5, slide support bracket 32 further includes a pair of locator arms 95, 96 arranged to lie in spaced-apart parallel relation to one another to receive the movable retainer 38 (e.g., lug body 64) therebetween. Each of locator arms 95, 96 is coupled to rack mount portion 44 and arranged to extend away from forwardly facing surface 52 of rack mount portion 44 into the second retainer aperture 25 formed in vertical rack 18 and to lie in side-by-side relation to retainer lug body 64 of movable retainer 38. Another embodiment of slide support bracket 132 showing locator arms 195, 196 is illustrated in FIGS. 14 and 15.

Quick-mount support 11 further includes a connector 97 arranged to pass through aligned connector retainer apertures 24, 34 formed, respectively, in each of vertical rack 18 and rack mount portion 44. Connector 97 and fastener 98 are configured to secure rack mount portion 44 in a fixed position relative to vertical rack 18 as shown, for example, in FIG. 12.

Thus, according to one aspect of the disclosure, a quick-mount support includes a support bracket, a fixed retainer coupled to support bracket, a movable retainer coupled to support bracket for pivotable movement toward and away from fixed retainer about a retainer pivot axis, and a pivotable actuator coupled to support bracket for pivotable movement about an actuator pivot axis that is configured to shift relative to retainer pivot axis. Movable retainer pivots about retainer pivot axis toward and away from fixed retainer in response to pivoting movement of pivotable actuator about actuator pivot axis to unmate and mate quick-mount support and vertical rack. According to another aspect of the disclosure, pivotable actuator is coupled to support bracket on an anchor mount by an elastic, deformable O-ring for pivotable movement about retainer pivot axis.

In the embodiment of FIGS. 10–13, a retainer mover 140 is provided to regulate movement of movable retainer 38. Retainer mover 140 includes an upright, elongated actuator 170 formed to include a finger grip 171 at one end, an aperture 179 adapted to receive an elastic deformable O-ring 77 therein at the other end, and a middle aperture 182 adapted to receive driver pin 72 therein to allow driver pin 72 to extend into boomerang-shaped slot 63 formed in movable retainer 38. Finger grip 171 is arranged to lie above movable retainer 38 as shown, for example, in FIGS. 11–13 so as to be accessible to a user. Bracket 32, fixed retainer 36, movable retainer 138, and retainer mover 140 cooperate to define quick-mount support 211.

What is claimed is:

1. A telescoping slide assembly support system comprising a telescoping slide assembly including load-carrying and stationary slides movable relative to one another to extend and retract the load-carrying slide relative to the stationary slide between fully extended and retracted positions, a rack formed to include a series of retainer apertures, and a quick-mount support coupled to the stationary slide including a fixed retainer arranged to extend through a first of the retainer apertures, a movable retainer mounted for pivoting movement toward and away from the fixed retainer about a retainer pivot axis and arranged to extend through a second of the retainer apertures, a pivotable actuator, an elastic, deformable O-ring for pivotally mounting the pivotable actuator about an actuator pivot axis, and a driver coupled to the pivotable actuator and coupled to the movable retainer to cause the movable retainer to pivot about the retainer pivot axis toward and away from the fixed retainer in response to pivoting movement of the pivotable actuator about the actuator pivot axis.

2. The system of claim 1, wherein the movable retainer includes an arcuate slot, and the driver coupled to the pivotable actuator is arranged to move in the arcuate slot to cause movable retainer to pivot about the retainer pivot axis in response to pivoting movement of the pivotable actuator about the actuator pivot axis.

3. The system of claim 2, wherein the arcuate slot includes a first lobe and a second lobe, the movable retainer includes a portion arranged to protrude into the arcuate slot between the first and second lobes, the driver moves from the first lobe into the second lobe past the protruding portion in the movable retainer as the pivotable actuator is pivoted about the actuator pivot axis to move the movable retainer away from the fixed retainer, and the driver moves from the second lobe into the first lobe past the protruding portion in the movable retainer as the pivotable actuator is pivoted about the actuator pivot axis to move the movable retainer toward the fixed retainer.

4. The system of claim 3, wherein the O-ring provides means for allowing the actuator pivot axis to shift as the driver moves in the arcuate slot past the protruding portion in the movable retainer.

5. The system of claim 3, wherein the O-ring is configured to compress as the driver moves past the protruding portion in the movable retainer, and then expand as the driver arrives in the first or second lobes in response to pivoting movement of the pivotable actuator.

6. The system of claim 5, wherein the amount of compression of the O-ring as the driver moves past the protruding portion in the movable retainer corresponds to the height of the protruding portion.

7. The system of claim 3, wherein the protruding portion marks an over-the-center position between the first and second lobes.

8. The system of claim 3, wherein the movable retainer is arranged to move away from the fixed retainer as the driver moves in the counterclockwise direction in the arcuate slot.

9. The system of claim 2, wherein the arcuate slot is boomerang-shaped.

10. The system of claim 2, wherein the O-ring is made from buna rubber.

11. The system of claim 2, wherein the movable retainer includes a retainer lug, a base and a mid-section interconnecting the retainer lug and the base, and the mid-section includes the arcuate slot.

12. The system of claim 11, wherein the retainer lug is configured to extend through the second of the retainer apertures and the pivotable actuator pivots the movable retainer about the retainer pivot axis to a lowered and unlocked position to permit movement of the retainer lug into and out of the second of the retainer apertures during coupling and uncoupling of the quick-mount support and the rack and to a raised and locked position to mate the retainer lug and the rack to block uncoupling of the quick-mount support and the rack.

13. The system of claim 11, wherein the base of the movable retainer includes a pivot mount-receiving aperture for receiving a pivot mount to mount the movable retainer for pivoting movement about the retainer pivot axis established by the pivot mount.

14. The system of claim 1, wherein the pivotable actuator includes a hub having a O-ring-receiving aperture, a driver arm cantilevered to the hub and having a driver-receiving aperture adapted to receive the driver, and a lever arm cantilevered to hub and shaped to be gripped by a user.

15. The system of claim 1, wherein the quick-mount support further includes a support bracket coupled to the stationary slide, an anchor mount coupled to the support bracket, and a pivot mount coupled to the support bracket, the fixed retainer includes an anchor mount-receiving aperture for receiving the anchor mount, the movable retainer includes a pivot mount-receiving aperture for receiving the pivot mount to mount the movable retainer for pivoting movement about the retainer pivot axis established by the pivot mount, the O-ring has an anchor mount-receiving aperture, the pivotable actuator has an O-ring-receiving aperture, the anchor mount is arranged to be received in the anchor mount-receiving aperture in the O-ring, and the O-ring is arranged to be received in the O-ring-receiving aperture in the pivotable actuator to mount the pivotable actuator for pivoting movement about the actuator pivot axis established by the anchor mount.

16. A telescoping slide assembly support system comprising a telescoping slide assembly including load-carrying and stationary slides movable relative to one another to extend and retract the load-carrying slide relative to the stationary slide between fully extended and retracted positions, a rack formed to include a series of retainer apertures, and a quick-mount support coupled to the stationary slide including a fixed retainer arranged to extend through a first of the retainer apertures, a movable retainer mounted for pivoting movement toward and away from the fixed retainer about a retainer pivot axis and arranged to extend through a second of the retainer apertures, the movable retainer including an arcuate slot, a pivotable actuator mounted for pivoting movement about an actuator pivot axis, and a driver coupled to the pivotable actuator and arranged to move in the arcuate slot in the movable retainer to cause movable retainer to pivot about the retainer pivot axis toward and away from the fixed retainer in response to pivoting movement of the pivotable actuator about the actuator pivot axis.

17. The system of claim 16, wherein the quick-mount support further includes an anchor mount and an elastic, deformable O-ring having an anchor mount-receiving aperture, the pivotable actuator has an O-ring-receiving aperture, the anchor mount is arranged to be received in the anchor mount-receiving aperture in the O-ring, and the O-ring is arranged to be received in the O-ring-receiving aperture in the pivotable actuator to mount the pivotable actuator for pivoting movement about the actuator pivot axis established by the anchor mount.

18. The system of claim 17, wherein the arcuate slot includes a first lobe and a second lobe, the movable retainer includes a portion arranged to protrude into the arcuate slot between the first and second lobes, the driver moves from the first lobe into the second lobe past the protruding portion in the movable retainer as the pivotable actuator is pivoted about the actuator pivot axis to move the movable retainer away from the fixed retainer, and the driver moves from the second lobe into the first lobe past the protruding portion in the movable retainer as the pivotable actuator is pivoted about the actuator pivot axis to move the movable retainer toward the fixed retainer.

19. The system of claim 18, wherein the O-ring is configured to compress as the driver moves past the protruding portion in the movable retainer, and then expand as the driver arrives in the first or second lobes in response to pivoting movement of the pivotable actuator.

20. A telescoping slide assembly support system comprising a telescoping slide assembly including load-carrying and stationary slides movable relative to one another to extend and retract the load-carrying slide relative to the stationary slide between fully extended and retracted positions, a rack formed to include a series of retainer apertures, and a quick-mount support coupled to the stationary slide including a fixed retainer arranged to extend through a first of the retainer apertures, a movable retainer mounted for pivoting movement toward and away from the fixed retainer about a retainer pivot axis and arranged to extend through a second of the retainer apertures, the movable retainer including an arcuate slot, a pivotable actuator, an elastic, deformable O-ring for pivotally mounting the pivotable actuator about an actuator pivot axis, and a driver coupled to the pivotable actuator and arranged to move in the arcuate slot in the movable retainer to cause movable retainer to pivot about the retainer pivot axis toward and away from the fixed retainer in response to pivoting movement of the pivotable actuator about the actuator pivot axis.

21. The system of claim 20, wherein the arcuate slot includes a first lobe and a second lobe, the movable retainer includes a portion arranged to protrude into the arcuate slot between the first and second lobes, the driver moves from the first lobe into the second lobe past the protruding portion in the movable retainer as the pivotable actuator is pivoted about the actuator pivot axis to move the movable retainer away from the fixed retainer, and the driver moves from the second lobe into the first lobe past the protruding portion in the movable retainer as the pivotable actuator is pivoted about the actuator pivot axis to move the movable retainer toward the fixed retainer.

22. The system of claim 21, wherein the O-ring is configured to compress as the driver moves past the protruding portion in the movable retainer, and then expand as the driver arrives in the first or second lobes in response to pivoting movement of the pivotable actuator.

23. A telescoping slide assembly support system comprising a telescoping slide assembly including load-carrying and stationary slides movable relative to one another to extend and retract the load-carrying slide relative to the stationary slide between fully extended and retracted positions, a rack formed to include a series of retainer apertures, and a quick-mount support coupled to the stationary slide including a fixed retainer arranged to extend through a first of the retainer apertures, a movable retainer mounted for pivoting movement toward and away from the fixed retainer about a retainer pivot axis and arranged to extend through a second of the retainer apertures, the movable retainer including an arcuate slot, a pivotable actuator, means for mounting the pivotable actuator for pivoting movement about an actuator pivot axis, and a driver coupled to the pivotable actuator and arranged to move in the arcuate slot in the movable retainer to cause the movable retainer to pivot about the retainer pivot axis toward and away from the fixed retainer in response to pivoting movement of the pivotable actuator about the actuator pivot axis, the mounting means allowing the actuator pivot axis to shift as the driver moves in the arcuate slot.

24. The system of claim 23, wherein the mounting means is an elastic, deformable O-ring.

* * * * *